United States Patent [19]

Safabakhsh

[11] Patent Number: 5,578,888
[45] Date of Patent: Nov. 26, 1996

[54] MULTI RESONANCE UNIBODY ULTRASONIC TRANSDUCER

[75] Inventor: Ali R. Safabakhsh, Yardley, Pa.

[73] Assignee: Kulicke and Soffa Investments, Inc., Wilmington, Del.

[21] Appl. No.: 349,251

[22] Filed: Dec. 5, 1994

[51] Int. Cl.⁶ .................................................. H02N 2/00
[52] U.S. Cl. ........................... 310/328; 310/317; 310/323
[58] Field of Search ..................................... 310/320, 321, 310/317, 323, 325, 328

[56] References Cited

U.S. PATENT DOCUMENTS

| 2,511,624 | 6/1950 | D'Halloy ................................. 310/331 |
| 3,564,304 | 2/1971 | Thorn et al. ............................ 310/323 |
| 3,578,996 | 5/1971 | Balamuth ................................ 310/323 |
| 3,783,309 | 1/1974 | Alibert et al. ........................... 310/323 |
| 3,955,545 | 5/1976 | Priegel .................................. 123/119 E |
| 4,736,131 | 3/1988 | Fujimoto ................................ 310/328 |
| 4,963,782 | 10/1990 | Bui et al. ................................ 310/358 |
| 5,001,681 | 3/1991 | Bertoldi et al. .......................... 310/330 |
| 5,196,756 | 3/1993 | Kohno et al. ............................ 310/328 |
| 5,460,595 | 10/1995 | Hall et al. ............................... 310/317 |

FOREIGN PATENT DOCUMENTS

| 0231940 | 8/1987 | European Pat. Off. ................ 310/325 |
| 0491667 | 3/1992 | Japan ..................................... 310/323 |

Primary Examiner—Thomas M. Dougherty
Attorney, Agent, or Firm—John B. Sowell, ATT

[57] ABSTRACT

A multi-resonance frequency ultrasonic transducer as a plurality of useful resonance frequencies for wire bonding operation and comprises an integral unibody with a rectangular aperture in the center of its mass. A multi-frequency stack of transducer drivers is mounted in the rectangular aperture with compression wedges. The length L of the stack of transducer drivers is equal to or less than one-quarter of one wavelength of the lower useful resonance frequency and the design envelopes for the useful frequencies embrace two or more useful fixed frequencies separated from spurious unusable frequencies by a minimum of two kilohertz.

12 Claims, 5 Drawing Sheets

MULTI RESONANCE UNIBODY ULTRASONIC TRANSDUCER

BACKGROUND OF THE INVENTION

1. Related Applications

This application is an improvement of my copending U.S. application Ser. No. 08/161,847 filed 6 Dec. 1993 for a UNIBODY ULTRASONIC TRANSDUCER.

2. Field of the Invention

The present invention relates to ultrasonic transducers of the type employed to bond two metallic elements together. More specifically, the present invention relates to a novel ultrasonic transducer of the type used on automatic wire bonders and ultrasonic bonding machines employed in the semiconductor industry.

3. Description of the Prior Art

Heretofore, ultrasonic transducers have been employed to bond fine wires to semiconductor pads and to the leads on lead frames or carriers to form electrical interconnecting gold and/or aluminum wires. Gold wires will bond to gold pads and leads using both pressure and heat to form a thermal compression bond. Gold wires will bond to the same gold pads or leads faster when ultrasonic scrub assist is added to the pressure and heat to form a thermosonic bond.

There can be found numerous academic opinions in the field of thermosonic fine wire bonding which advocate a single best frequency for making thermosonic wire bonds, however, manufacturers of automatic wire bonding machines and their customers who use such bonding machines to make highly reliable wire bonds have not standardized on the single best frequency. When more than one frequency is desired or needed, it has been necessary to change both the transducer and the generator to provide a different resonance frequency and this incurs a substantial downtime loss.

Heretofore, manufacturers of ultrasonic transducers used for fine wire bonding have offered standard fixed frequency generators and transducers. The fixed frequency transducers are provided with a mounting flange fixed at a zero displacement node when operated at the designed resonance frequency. When such prior art fixed frequency transducers are driven at multi (harmonic) frequencies of the designed fixed frequency, several problems arise which have prevented such prior art transducers from being useful at the higher harmonic frequency as will be explained in greater detail hereinafter.

It would be desirable to provide an ultrasonic transducer that is operable equally well at two or more fixed resonance frequencies in the range of frequencies that are useful for fine wire bonding operations. These frequencies presently extend from high sonic frequencies through the range of 300 kilohertz.

SUMMARY OF THE INVENTION

It is a primary object of the present invention to provide a single ultrasonic transducer that has a plurality of useful operating frequencies for wire bonding operations.

It is a primary object of the present invention to provide a single ultrasonic transducer that may be switched from one frequency to another frequency during a wire bonding operation.

It is a primary object of the present invention to provide a single ultrasonic transducer that may be driven at two different frequencies simultaneously during the same wire bonding operation.

It is a primary object of the present invention to provide a unibody ultrasonic transducer that has a plurality of designs envelopes one for each useful frequency which embraces two or more distinct useful fixed frequencies.

It is another primary object of the present invention to provide a novel method of bonding fine wires employing a plurality of different frequencies either sequentially or simultaneously or both.

According to these and other objects of the present invention, there is provided a multi-frequency ultrasonic transducer of the type having a plurality of resonance frequencies which need not be a integer harmonic of each other. A multi-frequency ultrasonic generator is coupled to the ultrasonic transducer and is provided with a controller for selecting one or more of a plurality of the resonance frequencies to the multi-frequency ultrasonic transducer during a wire bonding operation.

DESCRIPTION OF THE PREFERRED EMBODIMENTS

Before describing the prior art and the present invention, one should acknowledge that there are well known design rules for designing ultrasonic transducers of the type used for bonding fine wires. For example, the total length or thickness of the stack of driving elements which are made of piezo electric material should not substantially exceed one quarter of one wavelength of the desired resonance frequency. When such prior art transducers are driven at a different resonance frequency, the useful amplitude of the transducer is substantially diminished mainly because the zero nodes shift due to the non-symmetrical design. As a result of this shift, substantial energy losses occur which renders the transducer non-useful at the higher frequency.

Figure 1:
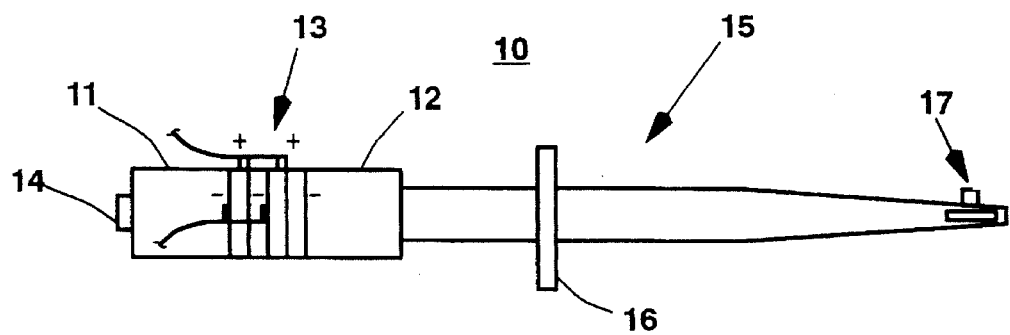
FIG. 1 is a top view of a typical prior ultrasonic transducer used for wire bonding at a fixed frequency of about 60 kilohertz.

Refer now to FIG. 1 showing a top view of a typical prior art ultrasonic transducer of the type used for wire bonding at a fixed frequency of about 60 kilohertz. The transducer 10 comprises a left end bell 11 and right end bell 12 having a stack of four piezo electric elements 13 clamped therebetween by a screw or bolt 14. The end bell 12 is shown attached to a transducer horn which comprises a mounting flange 16 and a capillary clamp 17.

Figure 2:
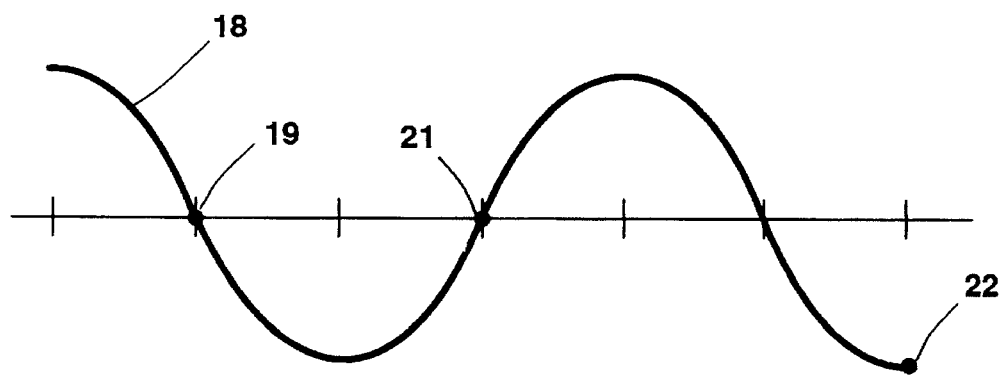
FIG. 2 is a displacement waveform showing the nodes and the amount of displacement along the longitudinal axis of the FIG. 1 ultrasonic transducer at about 60 kilohertz.

Refer now to FIG. 2 showing a displacement waveform diagram showing the nodes and the amount of displacement along the longitudinal axis of the transducer 10. The waveform 18 shown having a zero node 19 at the center of the stack 13. A second zero node 21 occurs at the mounting flange 16. The antinode 22 representative of the maximum displacement of the transducer horn 15 occurs at the capillary clamp 17.

Figure 3:
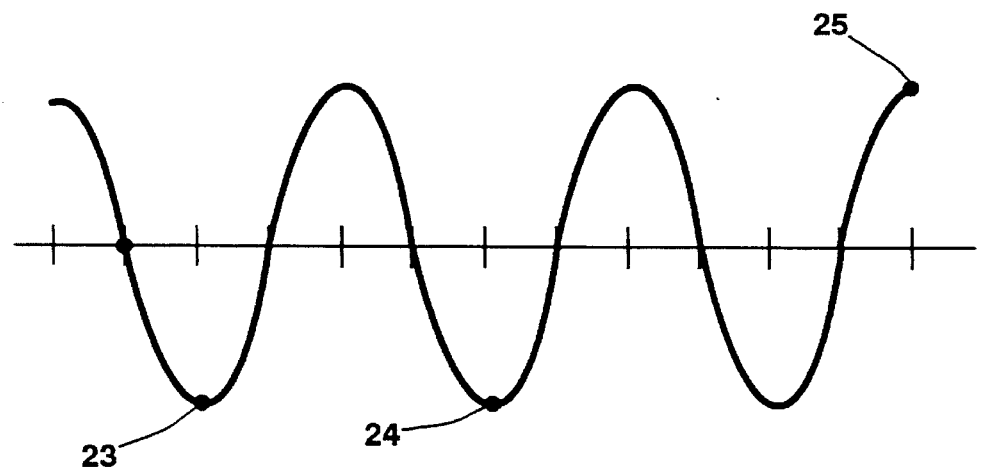
FIG. 3 is a displacement waveform showing the nodes and the amount of displacement along the longitudinal axis of the FIG. 1 ultrasonic transducer at about 120 kilohertz.

Refer now to FIG. 3 showing a displacement waveform and the nodes which occur along the longitudinal axis of the ultrasonic transducer 10 when driven at about 120 kilohertz. It will be noted that the first antinode 23 now occurs at the center of the stack instead of a zero node. Further the second antinode 24 now occurs at the point of the mounting flange 16. The third antinode 25 occurs at the correct position where the capillary clamp occurs.

It will be noted from reviewing FIGS. 1 through 3 that it will be necessary to move the mounting flange 16 from its position shown in FIGS. 1 and 2 to a position where a zero node occurs if the transducer 10 is to be driven at the higher frequency. If the mounting flange 16 is clamped to the mounting structure of a wire bonder, it will change the characteristic impedance of the transducer system and substantially attenuate the energy that is being transmitted to the capillary clamp 17.

Figure 4:
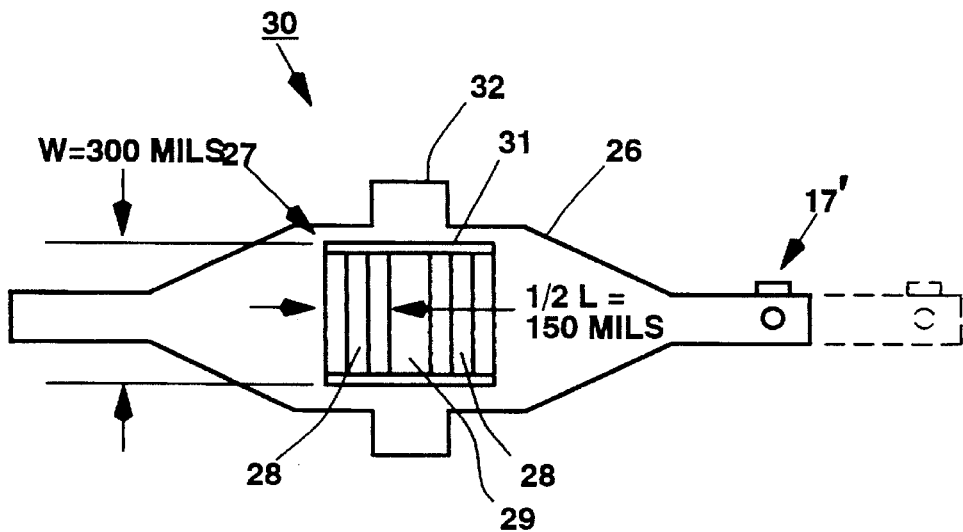
FIG. 4 is a top view of the present invention multi-resonant frequency unibody transducer used for wire bonding at more than one fixed frequency.

Refer now to FIG. 4 showing a top view of the present invention multi-resonance frequency unibody transducer 30 which comprises a symmetrical body 26 having a rectangular aperture 31 therein. A stack of piezo electric crystals 27 is mounted in the rectangular aperture 31 and comprises three piezo electric elements 28 placed on either side of a compression wedge 29. A mounting flange 32 is formed as an integral part of the body 26 at the zero node of the stack 27 at the zero node of the body 26. The capillary clamp 17' is provided at the antinode at one end of the body 26. A half stack of three elements 28 in the preferred embodiment transducer 30 is 300 mils wide by 150 mils long.

Figure 5:
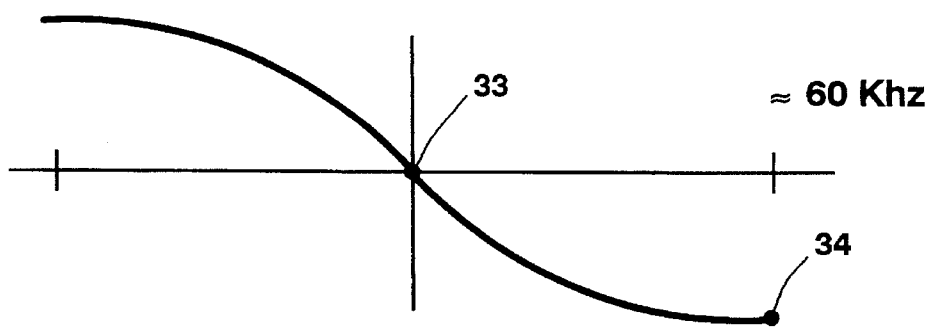
FIG. 5 is a displacement waveform for the transducer shown in FIG. 4 when driven at an ultrasonic frequency of about 60 kilohertz.

Refer now to FIG. 5 showing a displacement waveform for the transducer 30 shown in FIG. 4 when driven at an ultrasonic frequency of about 60 kilohertz. The zero node 33 occurs at the center of the unibody 26 and the center of the stack of the piezo electric crystals 28. The antinode 34 occurs at the capillary clamp 17'.

Figure 6:
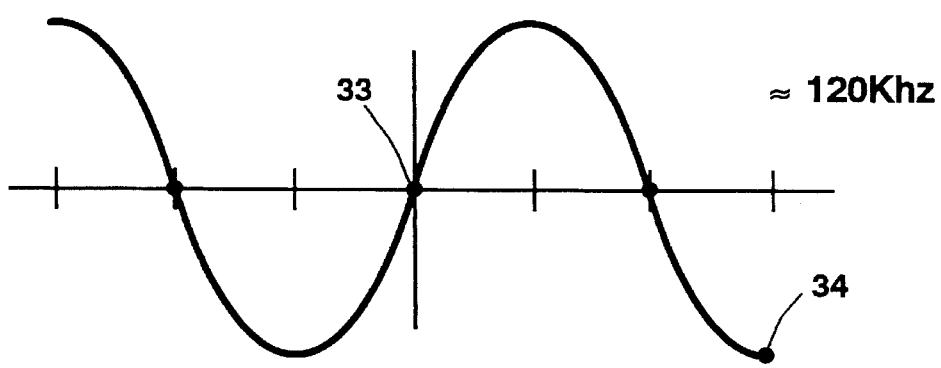
FIG. 6 is a displacement waveform for the transducer shown in FIG. 4 when driven at an ultrasonic frequency of about 120 kilohertz.

Refer now to FIG. 6 showing a displacement waveform for the same transducer 30 shown in FIG. 4 when driven at an ultrasonic frequency of about 120 kilohertz. It will be noted that the zero node 33 still occurs in the center of the waveform structure and that the antinode 34 still occurs at the capillary clamp 17'. It will be observed that the mounting flange 32 of the ultrasonic transducer 30 need not be moved when the piezo electric stack of crystals 27 is driven at the higher frequency which occurs at close to twice the base frequency.

Figure 7:
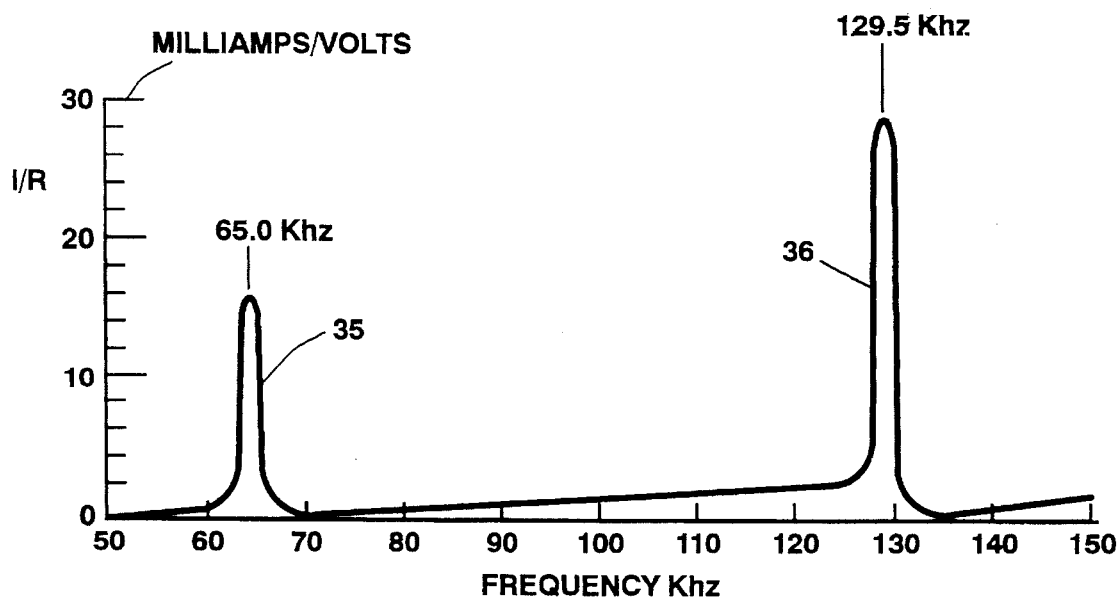
FIG. 7 is a electrical waveform showing the change of the reciprocal of resistance (1/R) over a range of frequencies from about 50 to 150 kilohertz for the present invention ultrasonic transducer shown in FIG. 4.

Refer now to FIG. 7 having an electrical waveform showing the change of the reciprocal of resistance (1/R) over a range of frequencies from about 50 to 150 kilohertz for the present invention transducer 30 shown in FIG. 4. The actual transducer from which the waveform shown in FIG. 7 was produced is a compromise that was achieved by creating a useful resonance frequency of approximately 60 kilohertz and shown to be 65.0 at waveform 35. In the same design envelope it was found that the higher frequency of approximately 120 kilohertz occurred at 129.5 kilohertz as shown at waveform 36. It will be noted that all of the non-useful resonance frequencies close to these chosen resonance frequencies were eliminated to provide a clean, useful resonance frequency at the waveforms 35 and 36.

Figure 8:
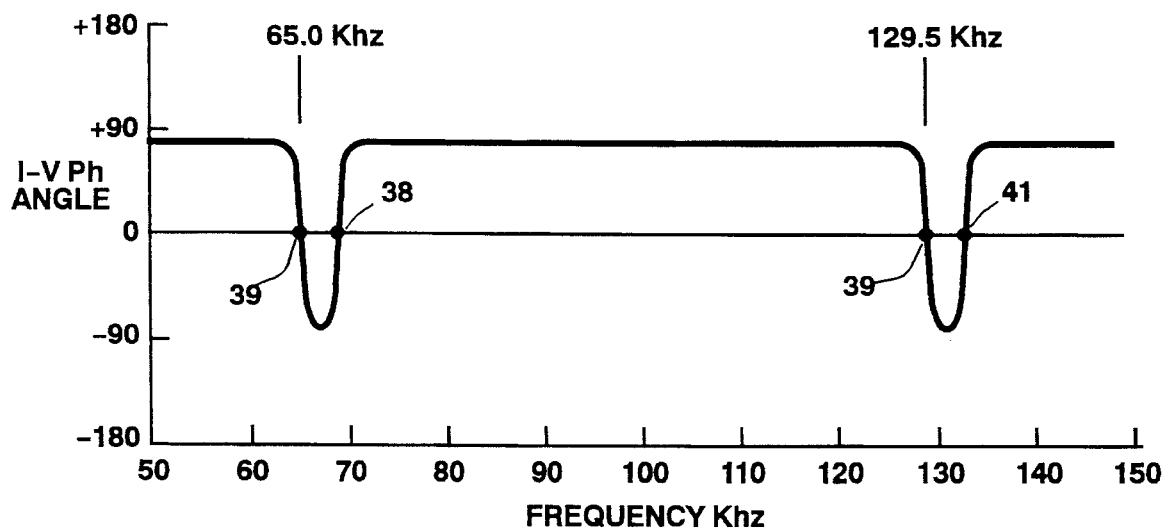
FIG. 8 is an electrical waveform showing the I-V phase difference between current (I) and voltage (V) in degrees over a range of frequencies from about 50 to 150 kilohertz for the ultrasonic transducer of FIG. 4.

Refer now to FIG. 8 showing an electrical waveform of the I-V phase difference between current and voltage in degrees over a range of frequencies from about 50 to 150 kilohertz. It will be noted that the zero phase difference occurs at the zero node 37 and 65.0 kilohertz and that there is an anti-resonance point at 38 at a substantially higher frequency. Further, there is a second node 39 at a zero phase angle which occurs at the higher frequency of 129.5 kilohertz. Point 41 is representative of the anti-resonance point and occurs at a substantially higher frequency. It is a requirement for proper control of the novel transducer that the zero phase angle at resonance point 37 be substantially separated from its anti-resonance point 38 and that the resonance frequency point 39 also be separated from its anti-resonance point 41 to permit controllability.

Figure 9:
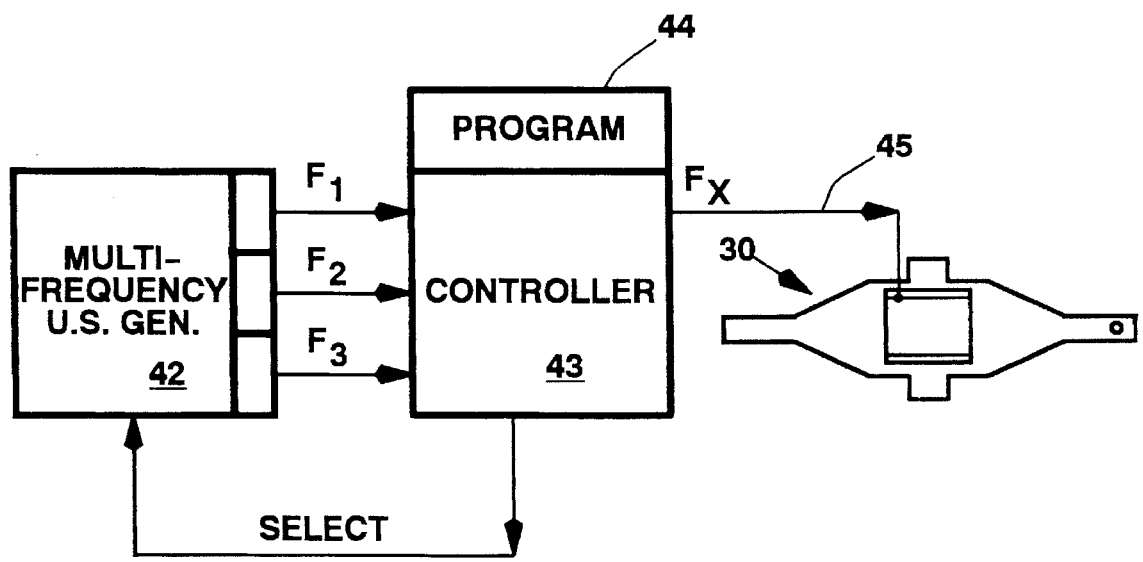
FIG. 9 is a schematic electrical diagram of the present invention transducer shown coupled to a multi-frequency generator.

Refer now to FIG. 9 showing a schematic electrical diagram of the present invention transducer 30 coupled to a multi-frequency generator 42. The generator 42 is shown having three distinct output frequencies F1, F2 and F3 which are near harmonics of a base frequency. The three frequencies shown are indicative of a plurality of useful frequencies which are applied to a controller 43 which is provided with programmable means 44 for selecting and/or combining the frequencies F1 through F3 to provide a desirable output frequency FX which may comprise a combination of any of the input frequencies. The output line 45 is shown connected to the stack of piezo electric crystals 27 of the transducer 30. It will be understood that the program means 44 permits a program to be entered which will control the coupling of the available plurality of frequencies to the ultrasonic transducer 30 during the formation of individual bonds so that a plurality of frequencies may be used for individual bonds and for different bonds.

Figure 10:
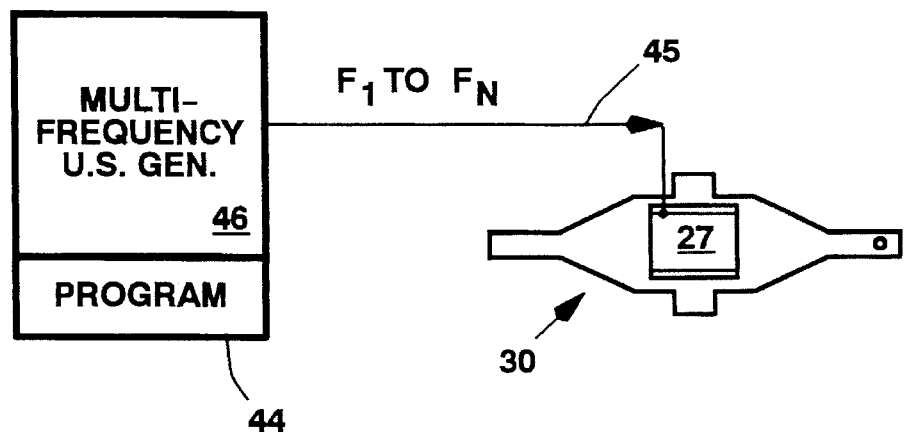
FIG. 10 is a more simplified electrical diagram of the same multi-frequency generator of FIG. 9 incorporating the controller with the generator.

Refer now to FIG. 10 showing a more simplified electrical diagram of the multi-frequency generator of FIG. 9 which incorporates the controller 43 into the generator 46. Prior art ultrasonic generators were designed for single frequencies. The present invention would require a plurality of such prior art generators. However, it is possible to produce an ultrasonic generator which has some mutual components and also produces a plurality of different desirable frequencies. When these plural generators are incorporated with the controller, the cost of the multi-frequency generator is substantially reduce.

Figure 11A:
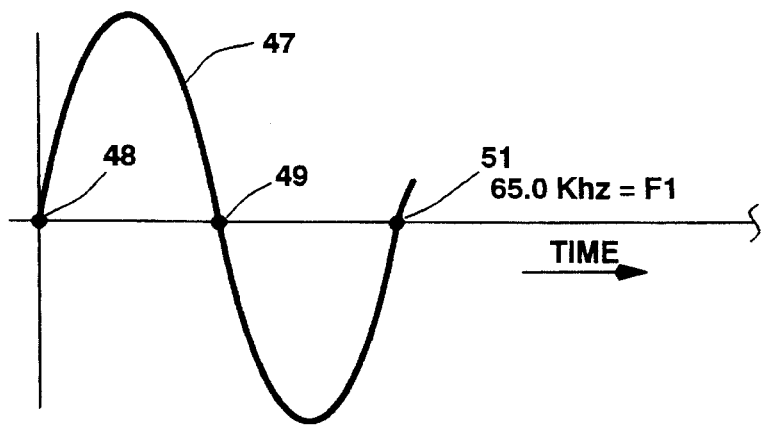
FIGS. 11A and 11B are displacement versus time waveform diagrams showing two different resonance frequencies of a transducer that are not true integer harmonics of the base frequency.

Refer now to FIG. 11A showing a waveform diagram of displacement versus time at the capillary clamp point 17.

Figure 11B:
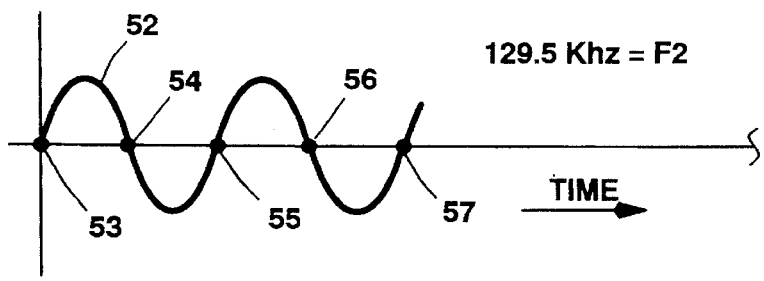

Waveform 47 represents the displacement which occurs as a result of the 65.0 kilohertz signal from the generator and causes the displacement points 48, 49 and 51 to occur at particular times. The displacement waveform 52 shown in FIG. 11B occurs as a result of the application of energy at 129.5 kilohertz and causes the capillary clamp 17 to have zero displacement at the times 53 through 57. If the base time at points 48 and 53 occur simultaneously, then the waveform 52 which is occurring at somewhat less than twice the frequency of the waveform at 47 does not match the zero displacement points 49, 51 etc. of the lower frequency waveform 47 at continuing large time divergence.

Figure 11C:
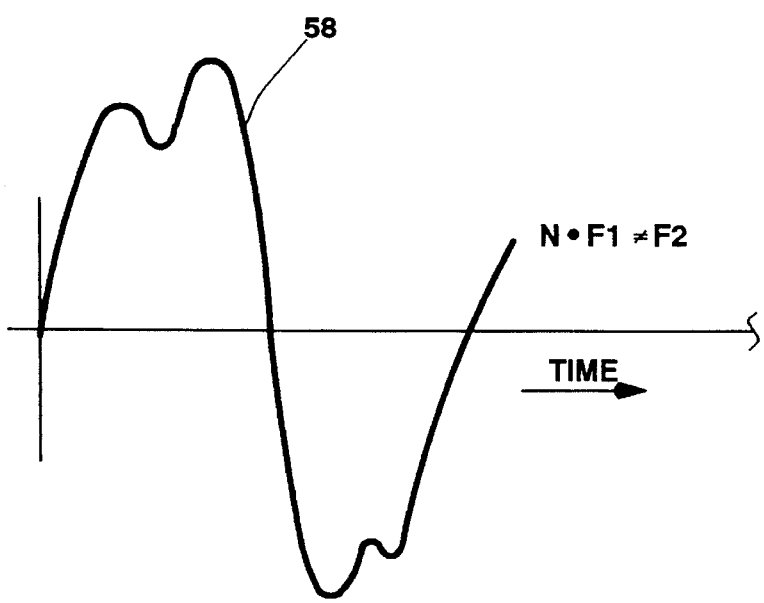
FIG. 11C is a displacement versus time waveform of the combined FIGS. 11A and 11B which provide a variable amplitude and output frequency signal that is useful for performing bonding operations.

When the waveform 47 and 52 are combined as shown in FIG. 11C, the maximum displacements are not occurring simultaneously but are shifting over a time range which causes a unique waveform 58 that continues to change over a time period. The bonding time for a first or second bond of a interconnecting wire may extend over 10 milliseconds or 600 of the waveforms 47. Thus, it will be understood that the waveform 58 is continuing to change from a maximum amplitude to a minimum amplitude and shift back to a maximum amplitude over the 10 milliseconds or more bonding time. Having explained that the combination of two frequencies could create a variable amplitude displacement curve for the capillary clamp point 17 of the ultrasonic transducer 30, it is now possible to generate an unlimited combination of amplitude signatures for producing optimum bonding characteristics. Further, it is possible to program the introduction of the different frequencies into different time slots during a single bond operation so that it is now possible to custom design a displacement envelope for the bonding of interconnecting wires to different types of materials. For example, some carriers or lead frames may have become highly oxidized and will require additional scrubbing before the actual bonding operation takes place. This pre bond scrubbing operation can be custom designed into the bonding operation by conducting a series of tests during set up.

Having explained a preferred embodiment of the present invention its will now be understood that a single ultrasonic transducer can be provided which will achieve a useful resonance frequency at a plurality of fixed frequencies that are not necessarily the exact harmonics of the base frequency. It is possible to design the present unibody ultrasonic transducer to operate at fixed frequencies that are substantial harmonies of the base frequency which simplifies the design and cost of a multi frequency generator. The present invention transducer does not obsolete or require a substantial change of prior art ultrasonic generators which have embodied automatic impedance and/or frequency controls.

What is claimed is:

1. A multi-resonance frequency ultrasonic transducer having a efficient lower and higher resonance frequency, comprising:

an monolythic transducer body, a rectangular aperture in the approximate center of mass of said transducer body, said aperture having an axial length and a transverse width, a multi-resonance frequency transducer driver comprising a plurality of piezo electric crystals forming a stack of length L and a width W mounted in compression under load along the axial length direction of said aperture, said stack of piezo electric crystals having a length L which is equal to or greater than one-quarter of one wavelength of the higher resonance frequency, said stack of piezo electric crystals of length L being smaller than one-quarter of one wavelength of said lower resonance frequency, and the design resonance frequency impedance characteristics of unibody transducer being such that it embraces both useful higher and the lower resonance frequencies.

2. A multi-resonance frequency ultrasonic transducer as set forth in claim 1 wherein said stack of piezo electric crystals comprise a plurality of individual crystals greater than four and less than eight.

3. A multi-resonance frequency ultrasonic transducer as set forth in claim 1 wherein said stack of piezo electric crystals comprise six piezo electric individual crystals electrically connected in parallel.

4. A multi-resonance frequency ultrasonic transducer as set forth in claim 1 wherein the length L of said stack of piezo electric crystals is greater than one-quarter of one wavelength of said higher resonance frequency by a factor of less than ten percent.

5. A multi-resonance frequency transducer as set forth in claim 4 wherein said stack length L is approximately 0.30 to 0.450 inches.

6. A multi-resonance frequency ultrasonic transducer as set forth in claim 4 wherein said length L of said stack of piezo electric crystals is smaller than one-quarter of one wavelength of said lower base resonance frequency by a factor of less than ten percent.

7. A multi-resonance frequency transducer as set forth in claim 1 wherein said lower resonance frequency and said higher resonance frequency are separated from spurious unusable resonance frequencies by a minimum of two kilohertz.

8. A multi-resonance frequency transducer as set forth in claim 7 wherein said lower and said higher resonance frequencies are separated from spurious unusable resonance frequencies by up to six kilohertz.

9. A multi-resonance frequency transducer as set forth in claim 1 wherein said resonance frequencies are distant resonance frequencies separated from anti-resonance frequencies in a clean window of five kilohertz on either side of said resonance frequencies.

10. A multi-resonance frequency transducer as set forth in claim 1 which further includes:

multi-resonance frequency signal generating means for producing a plurality of resonance frequencies, and means for coupling one or more of said resonance frequency signals to said ultrasonic transducer during a bonding operation.

11. A multi-resonance frequency transducer as set forth in claim 10 which further includes programmable means for selecting one or more of said resonance frequency signals to said ultrasonic transducer during a bonding operation.

12. A multi-resonance frequency transducer as set forth in claim 10 wherein said generating means comprise a plurality of ultrasonic generators for coupling to said transducer means, and programmable means coupled to said generating means for producing a plurality of resonance frequencies at the output of said generating means.

\* \* \* \* \*